US007187293B2

(12) United States Patent
White et al.

(10) Patent No.: US 7,187,293 B2
(45) Date of Patent: Mar. 6, 2007

(54) SINGULATION OF RADIO FREQUENCY IDENTIFICATION (RFID) TAGS FOR TESTING AND/OR PROGRAMMING

(75) Inventors: Joseph White, Woodbine, MD (US); Theodore Hockey, Mount Airy, MD (US)

(73) Assignee: Symbol Technologies, Inc., Holtsville, NY (US)

( * ) Notice: Subject to any disclaimer, the term of this patent is extended or adjusted under 35 U.S.C. 154(b) by 0 days.

(21) Appl. No.: 11/205,026

(22) Filed: Aug. 17, 2005

(65) Prior Publication Data

US 2006/0038687 A1 Feb. 23, 2006

Related U.S. Application Data

(60) Provisional application No. 60/601,991, filed on Aug. 17, 2004.

(51) Int. Cl.
*G08B 13/14* (2006.01)

(52) U.S. Cl. .................. 340/582.8; 340/572.4; 340/572.1; 340/10.1; 343/841; 343/842; 235/435; 235/439

(58) Field of Classification Search .......... 340/572.8, 340/572.4, 572.1, 10.1; 343/841, 842; 235/435, 235/439

See application file for complete search history.

(56) References Cited

U.S. PATENT DOCUMENTS 3,724,737 A 4/1973 Bodnar

| | | | |
|---|---|---|---|
| 3,891,157 | A | 6/1975 | Justus |
| 3,989,575 | A | 11/1976 | Davies et al. |
| 4,346,514 | A | 8/1982 | Makizawa et al. |
| 4,480,742 | A | 11/1984 | Muylle |
| 4,925,808 | A | 5/1990 | Richardson |
| 5,519,381 | A | 5/1996 | Marsh et al. |
| 5,528,222 | A | 6/1996 | Moskowitz et al. |
| 5,537,105 | A | 7/1996 | Marsh et al. |
| 5,557,280 | A | 9/1996 | Marsh et al. |
| 5,564,888 | A | 10/1996 | Doan |
| 5,566,441 | A | 10/1996 | Marsh et al. |

(Continued)

FOREIGN PATENT DOCUMENTS

DE 196 34 473 C2 1/1998

(Continued)

OTHER PUBLICATIONS

English Language Abstract for DE 19634473, published Jan. 22, 1998, 1 page.

(Continued)

*Primary Examiner*—Tai Nguyen
(74) *Attorney, Agent, or Firm*—Sterne, Kessler, Goldstein & Fox PLLC

(57) ABSTRACT

Methods, systems, and apparatuses for a radio frequency identification (RFID) tag tester/programmer and marker are described. A surface is in contact with a web of RFID tags. The surface has a first portion and a second portion. The first portion of the surface is grounded to ground tags of the web that are in contact with the first portion. A radio frequency (RF) source transmits a RF signal to interact with a tag adjacent to the second portion of the surface. The RF signal may be a signal for testing the tag and/or a signal for programming the tag.

32 Claims, 5 Drawing Sheets

U.S. PATENT DOCUMENTS

| | | | |
|---|---|---|---|
| 5,585,193 A | 12/1996 | Josephy et al. | |
| 5,767,789 A * | 6/1998 | Afzali-Ardakani et al. | 340/10.1 |
| 5,837,349 A | 11/1998 | Van Erden et al. | |
| 5,904,546 A | 5/1999 | Wood et al. | |
| 5,946,198 A | 8/1999 | Hoppe et al. | |
| 5,982,284 A | 11/1999 | Baldwin et al. | |
| 6,002,344 A | 12/1999 | Bandy et al. | |
| 6,018,299 A | 1/2000 | Eberhardt | |
| 6,082,660 A | 7/2000 | Meyer | |
| 6,091,332 A | 7/2000 | Eberhardt et al. | |
| 6,104,291 A * | 8/2000 | Beauvillier et al. | 340/572.1 |
| 6,145,901 A | 11/2000 | Rich | |
| 6,147,662 A | 11/2000 | Grabau et al. | |
| 6,165,386 A | 12/2000 | Endo et al. | |
| 6,206,292 B1 | 3/2001 | Robertz et al. | |
| 6,262,692 B1 | 7/2001 | Babb | |
| 6,265,977 B1 | 7/2001 | Vega et al. | |
| 6,281,795 B1 | 8/2001 | Smith et al. | |
| 6,322,903 B1 | 11/2001 | Siniaguine et al. | |
| 6,416,608 B1 | 7/2002 | Mynott et al. | |
| 6,451,154 B1 | 9/2002 | Grabau et al. | |
| 6,514,790 B1 | 2/2003 | Plettner et al. | |
| 6,606,247 B2 | 8/2003 | Credelle et al. | |
| 6,608,370 B1 | 8/2003 | Chen et al. | |
| 6,731,353 B1 | 5/2004 | Credelle et al. | |
| 2002/0149481 A1 | 10/2002 | Shanks et al. | |
| 2003/0136503 A1 | 7/2003 | Green et al. | |

FOREIGN PATENT DOCUMENTS

| | | |
|---|---|---|
| DE | 198 05 031 C2 | 8/1999 |
| DE | 198 40 226 A1 | 3/2000 |
| FR | 2 775 533 | 9/1999 |
| WO | WO 00/14733 A1 | 3/2000 |
| WO | WO 01/54058 A1 | 7/2001 |
| WO | WO 01/61646 A1 | 8/2001 |
| WO | WO 01/95241 A1 | 12/2001 |
| WO | WO 02/37414 A1 | 5/2002 |
| WO | WO 02/49093 A1 | 6/2002 |
| WO | WO 02/082368 A1 | 10/2002 |

OTHER PUBLICATIONS

English Language Abstract for DE 19805031, published Aug. 19, 1999, 1 page.

English Language Abstract for DE 19840226, published Mar. 16, 2000, 1 page.

English Language Abstract for FR 2775533, published Sep. 3, 1999, 1 page.

Sarma, Sanjay, "White Paper-Towards the 5¢ Tag", Auto-ID Center, Published Nov. 1, 2001, pp. 1-19.

International Search Report, dated Apr. 21, 2006, 8 pgs.

* cited by examiner

SINGULATION OF RADIO FREQUENCY IDENTIFICATION (RFID) TAGS FOR TESTING AND/OR PROGRAMMING

This application claims the benefit of U.S. Provisional Application No. 60/601,991, filed Aug. 17, 2004, which is incorporated herein by reference in its entirety.

BACKGROUND OF THE INVENTION

1. Field of the Invention

The present invention relates to high volume testing and programming of radio frequency identification (RFID) tags, including inlays and labels.

2. Background Art

Radio frequency identification (RFID) tags are electronic devices that may be affixed to items whose presence is to be detected and/or monitored. The presence of an RFID tag, and therefore the presence of the item to which the tag is affixed, may be checked and monitored by devices known as "readers." Readers typically transmit radio frequency signals to which the tags respond. Each tag can store a unique identification number. The tags respond to the reader transmitted signals by providing their identification number, bit-by-bit, so that they can be identified.

Currently, some RFID tags are assembled and then laminated to the face sheet of a pressure sensitive laminate. Once laminated, the backside of the RFID tag is coated with an adhesive, and a release liner is applied. After the release liner is applied, the tag is printed and/or die cut into the desired form factor.

A tag can be tested either before or after the lamination process. Testing before or after the lamination process is difficult in a web format, where tags are formed in an array of tags in a single sheet of material. When testing tags in a web format, any bad or failed (e.g., non-functional, malfunctioned) tags have to be removed and replaced with good (e.g., functional) tags, which tends to be expensive and time consuming.

Thus, methods, systems, and apparatuses are needed for testing and programming tags in high volume webs, while allowing for improved handling of any failed tags.

BRIEF SUMMARY OF THE INVENTION

Methods, systems, and apparatuses for interacting with radio frequency identification (RFID) tags are described. In example aspects of the present invention, tags are interacted with by testing the tags and/or programming the tags. According to aspect of the present invention, testing and programming can occur in high volume webs of tags, allowing for improved handling of failed tags.

In a first example aspect of the present invention, a system is used to interact with a plurality of RFID tags provided in a roll, web, or any other format. The system supplies the plurality of tags using a supply spool or other mechanism, and receives the tags with a collection spool or other mechanism. A stepper motor or other mechanism can be used to feed the tags to the collection spool.

The tags are fed across a surface, so that the surface is in contact with the tags. The surface has a first portion and a second portion. The first portion of the surface is grounded (or coupled to another suitable potential) to inhibit operation of tags that are in contact with the first portion. The second portion of the surface does not inhibit operation of tags that are adjacent to the second portion. A radio frequency (RF) source transmits a RF signal to interact with a tag adjacent to the second portion of the surface.

In example aspects, the RF signal may be a signal for testing the tag and/or a signal for programming the tag.

In further aspects, the tags can be moved/advanced to move further tags adjacent to the second portion of the surface so that they may be interacted with.

These and other advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
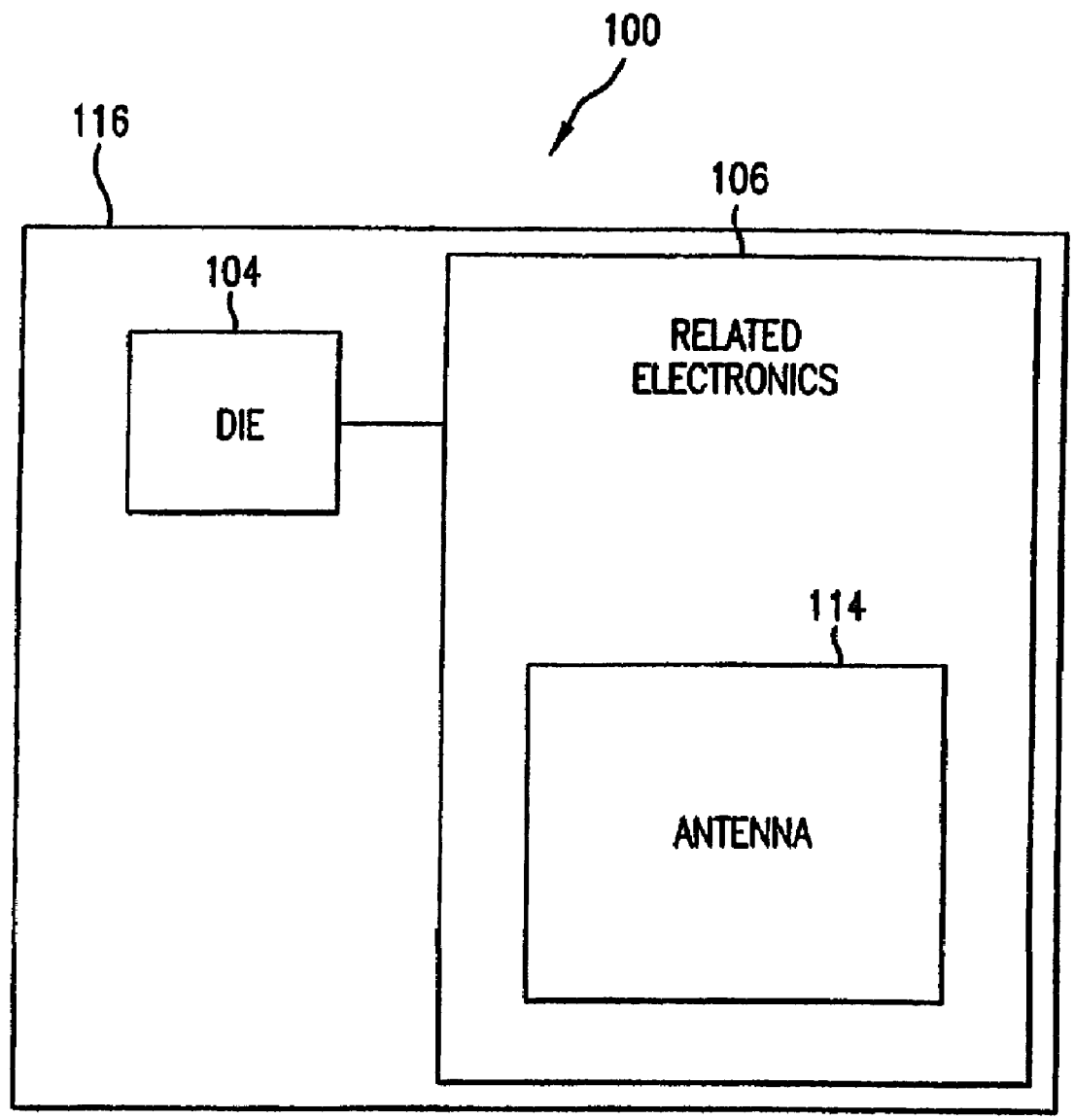
FIG. 1 shows a block diagram of an exemplary RFID tag, according to an embodiment of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

The present invention enables the interaction of an RF signal with electronic devices, such as tags fabricated in a roll (i.e., a single tag-width substantially continuous column) or web (i.e., a multi-tag width array of tags that is substantially continuous) of RFID tags. For example, the interaction may enable the testing and/or programming of RFID tags, including inlays and labels, such as ultra-high frequency (UHF) tags. Furthermore, in embodiments, the present invention allows for the marking of any failed tags for removal, sorting, disablement, and/or other purposes.

For illustrative purposes, the description herein primarily relates to the testing and programming of RFID tags. However, the invention is also adaptable to further electronic device types (e.g., electronic devices including one or more IC dies or other electrical components mounted thereto), as would be understood by persons skilled in the relevant art(s) from the teachings herein.

FIG. 1 shows a block diagram of an exemplary RFID tag 100, according to an embodiment of the present invention. As shown in FIG. 1, RFID tag 100 includes a die 104 and related electronics 106 located on a tag substrate 116. Related electronics 106 includes an antenna 114 in the present example. Die 104 can be mounted onto antenna 114 of related electronics 106, or on other locations of substrate 116. As is further described elsewhere herein, die 104 may be mounted in either a pads up or pads down orientation.

RFID tag 100 may be located in an area having a large number, population, or pool of RFID tags present. Tag 100 receives interrogation signals transmitted by one or more tag readers. According to interrogation protocols, tag 100 responds to these signals. The response(s) of tag 100 includes information that the reader can use to identify the corresponding tag 100. Once the tag 100 is identified, the existence of tag 100 within a coverage area defined by the tag reader is ascertained.

RFID tag 100 may be used in various applications, such as inventory control, airport baggage monitoring, as well as security and surveillance applications. Thus, tag 100 can be affixed to items such as airline baggage, retail inventory, warehouse inventory, automobiles, compact discs (CDs), digital video discs (DVDs), video tapes, and other objects. Tag 100 enables location monitoring and real time tracking of such items.

In the present embodiment, die 104 is an integrated circuit that performs RFID operations, such as communicating with one or more tag readers (not shown) according to various interrogation protocols. Exemplary interrogation protocols are described in U.S. Pat. No. 6,002,344 issued Dec. 14, 1999 to Bandy et al., titled "System and Method for Electronic Inventory," and U.S. patent application Ser. No. 10/072,885, filed on Feb. 12, 2002, both of which are incorporated by reference herein in their entirety. Die 104 includes a plurality of contact pads that each provide an electrical connection with related electronics 106.

Related electronics 106 are connected to die 104 through a plurality of contact pads of IC die 104. In embodiments, related electronics 106 provide one or more capabilities, including RF reception and transmission capabilities, impedance matching, sensor functionality, power reception and storage functionality, as well as additional capabilities. The components of related electronics 106 can be printed onto a tag substrate 116 with materials, such as conductive inks. Examples of conductive inks include silver conductors 5000, 5021, and 5025, produced by DuPont Electronic Materials of Research Triangle Park, N.C. Other example materials or means suitable for printing related electronics 106 onto tag substrate 116 include polymeric dielectric composition 5018 and carbon-based PTC resistor paste 7282, which are also produced by DuPont Electronic Materials of Research Triangle Park, N.C. Other materials or means that may be used to deposit the component material onto the substrate would be apparent to persons skilled in the relevant art(s) from the teachings herein.

As shown in FIG. 1, tag substrate 116 has a first surface that accommodates die 104, related electronics 106, as well as further components of tag 100. Tag substrate 116 also has a second surface that is opposite the first surface. An adhesive material and/or backing can be included on the second surface. When present, an adhesive backing enables tag 100 to be attached to objects, such as books, containers, and consumer products. Tag substrate 116 is made from a material, such as polyester, paper, plastic, fabrics such as cloth, and/or other materials such as commercially available Tyvec®.

Embodiments of the present invention are applicable to all types of tags, including inlays and labels. A "tag inlay" or "inlay" is used generally to refer to an assembled RFID device that generally includes a integrated circuit chip and antenna formed on a substrate. A "label" is used generally to refer to an inlay that has been attached to a pressure sensitive adhesive (PSA) construction, or laminated and then cut and stacked for application through in-mould, wet glue or heat seal application processes, for example. A variety of label types are contemplated by the present invention. In an embodiment, a label includes an inlay attached to a release liner by pressure sensitive adhesive. The release liner may be coated with a low-to-non-stick material, such as silicone, so that it adheres to the pressure sensitive adhesive, but may be easily removed (e.g., by peeling away). After removing the release liner, the label may be attached to a surface of an object, or placed in the object, adhering to the object by the pressure sensitive adhesive.

In some implementations of tags 100, tag substrate 116 can include an indentation, "cavity," or "cell" (not shown in FIG. 1) that accommodates die 104. An example of such an implementation is included in a "pads up" orientation of die 104.

Figure 2:
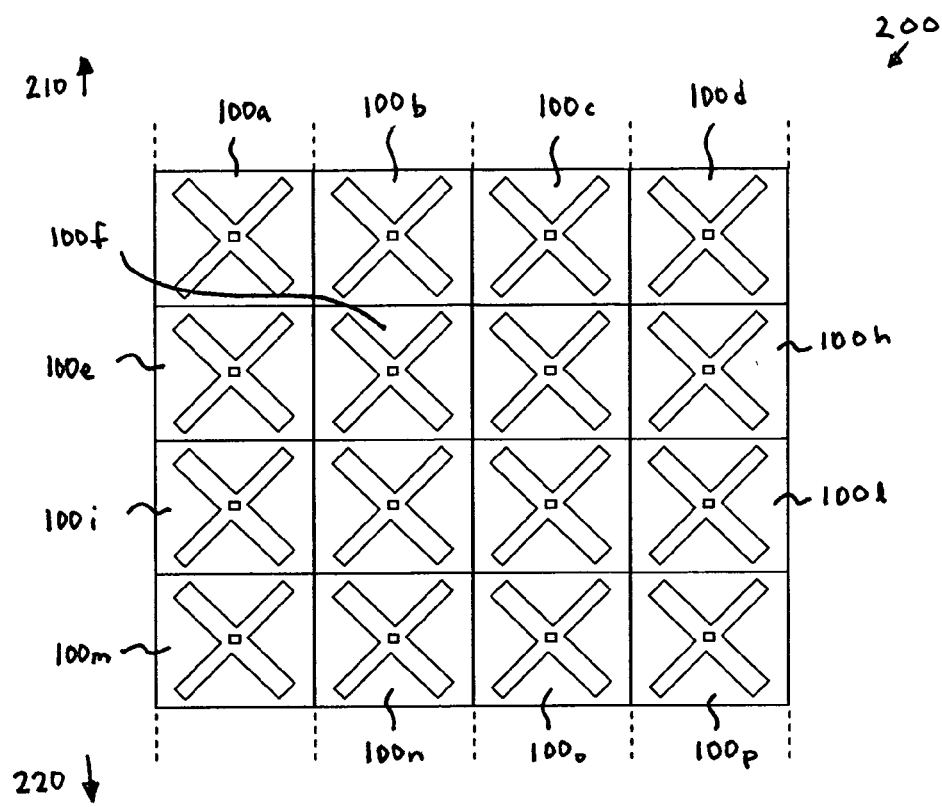
FIG. 2 shows a plan view of an example web of tags.

Volume production of RFID tags, such as tag 100, is typically accomplished on a printing web based system. For example, in such a system, the tags are assembled in a roll or web of substrates, which may be a sheet of substrates, a continuous roll of substrates, or other group of substrates. For instance, FIG. 2 shows a plan view of an example web 200 that is a continuous roll type. As shown in FIG. 2, web 200 may extend further in the directions indicated by arrows 210 and 220. Web 200 includes a plurality of tags 100a–p. In the example of FIG. 2, the plurality of tags 100a–p in web 200 is arranged in a plurality of rows and columns. The present invention is applicable to any number of rows and columns of tags, and to other arrangements of tags, in a roll, web, or other format.

During or after the manufacture of a tag, such as tag 100, the tag may processed by a system that interacts with the tag. For example, the system may test and/or program the tag. For instance, the tag may be tested to check for defects in functionality, such as its ability to detect a reader interrogation, and to respond. Furthermore, data may be directly encoded in, or transmitted to the tag (e.g., by a reader), to be stored on the tag. For example, the data may be an identification number for the tag.

On a web, such as web 200, RFID tags are typically assembled/positioned as close to each other as possible to maximize throughput, thus making the process of reading and testing individual tags difficult. Because of the close spacing, it is very difficult to localize a radiated (e.g., radio frequency) reader field to excite only one tag. Thus, interacting with a specific tag can be difficult. Furthermore, typically, an assembly line must be customized to accommodate the roll or web and the specific type of tags. The testing/programming process becomes even more difficult and expensive considering that RFID tags, for example, come in different forms, sizes and shapes.

In an embodiment of the present invention, an apparatus tests and/or programs a RFID tag in a continuous web of RFID tags, such as in web 200, by exposing it to a radio frequency (RF) test signal, while nearby RFID tags of the web are isolated from the RF test signal. In this manner, a specific tag can be tested, while nearby tags are prevented from also responding to the RF test signal. Furthermore, in embodiments, the apparatus accommodates different types of RFID tags without the need for significant changes to the assembly line.

Figure 3:
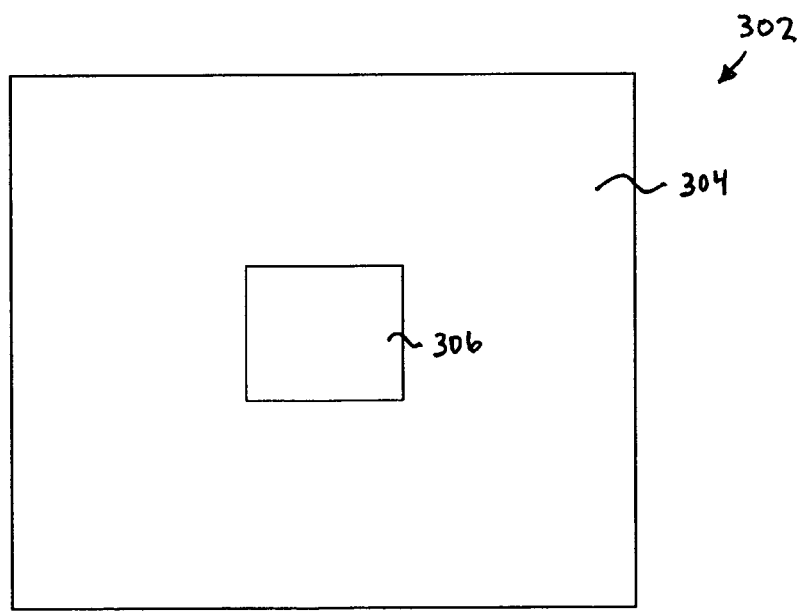
FIG. 3 shows a plan view of an example grounded surface, according to an embodiment of the present invention.

FIG. 3 shows a plan view of an example contact surface 302, according to an embodiment of the present invention. As shown in FIG. 3, contact surface 302 has a first portion 304 and a second portion 306. First portion 304 of contact surface 302 can be made from any electrically conductive material, such as a metal. Second portion 306 can be an opening through contact surface 302, or can be spanned by an electrically non-conductive material, such as a sheet of plastic, glass, a polymer, etc.

Figure 4:
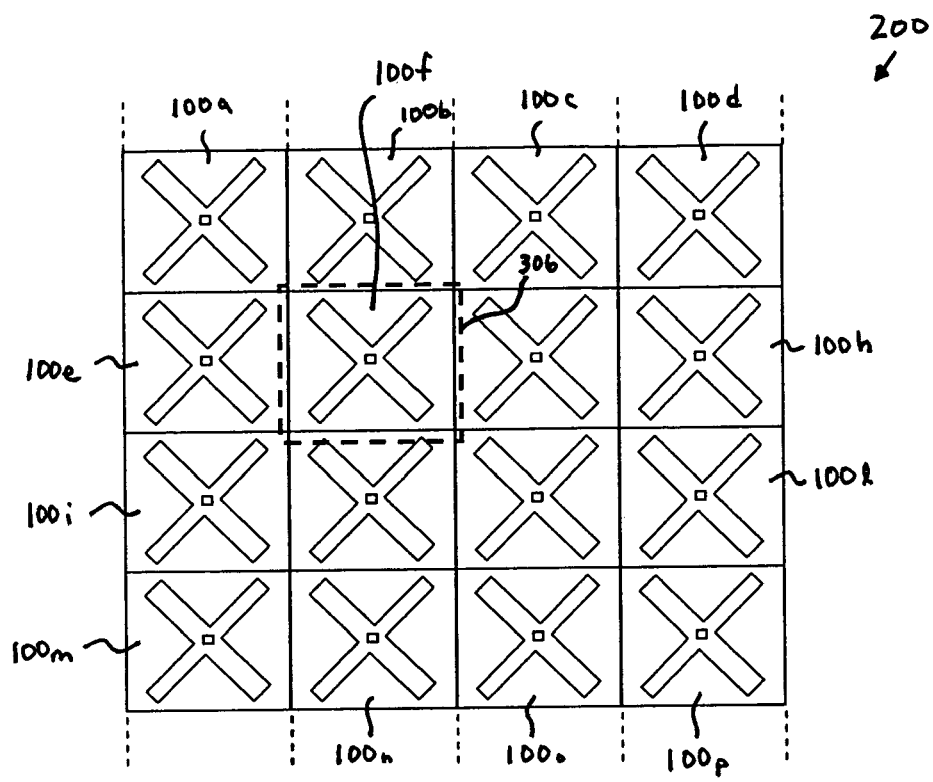
FIG. 4 shows the web of tags of FIG. 2 in contact with the grounded surface of FIG. 3, according to an example embodiment of the present invention.

When in use, contact surface 302 is contacted with a roll or web of tags. For example, FIG. 4 shows a plan view of web 200 of FIG. 2 in contact with contact surface 302, according to an example embodiment of the present invention. In FIG. 4, contact surface 302 is not shown, only an outline of second portion 306 is indicated by a dotted line. This is because contact surface 302 is in contact with the opposite side of web 200, not shown in FIG. 4, so contact surface 302 is not visible in FIG. 4. In FIG. 4, web 200 is disposed across contact surface 302 so that a large area of web 200 is in contact with contact surface 302.

In an embodiment, contact surface 302 is electrically coupled to an electrical potential, such as a ground potential or other potential, to electrically hold tags of web 200 that are in contact with first portion 304 at the potential. For example, in FIG. 4, tags 100a–e,g–p in contact with first portion 304 are grounded (or held at another potential) by first portion 304. Because the tags are held at the potential, they are caused to be in a non-operational state. For example, electrically conductive portions of the tags of web 200, such as their antennas, may be held at the potential due to contact with first portion 304 of contact surface 302. If the tags are passive tags (i.e., no onboard power source), they cannot receive power from the RF signal, and are thus not operational. Note that although the potential may be generally referred to as a ground potential herein, the potential can be any potential that causes tags coupled thereto to be non-operational (e.g., not able to respond to an RF test and/or programming signal).

Figure 5:
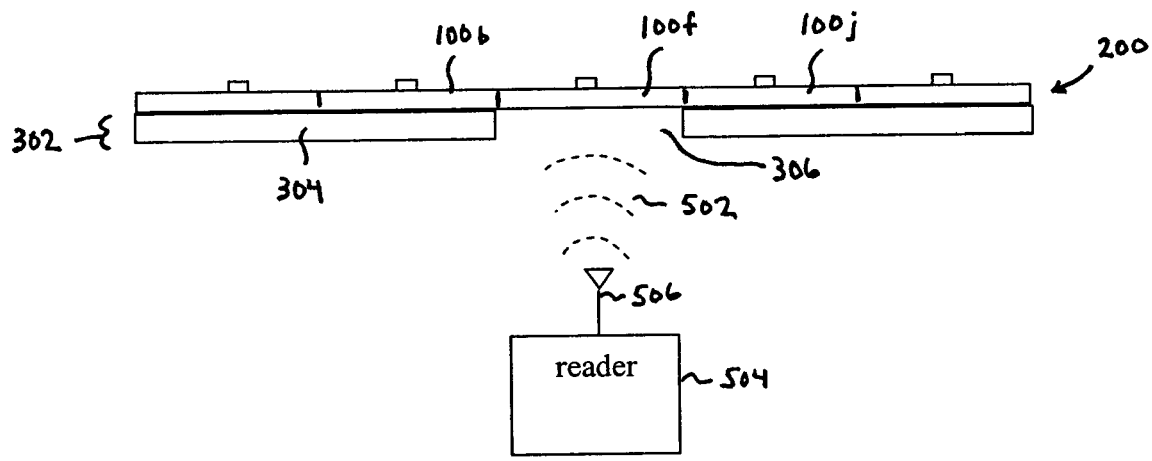
FIG. 5 shows a cross-sectional view of a radio frequency signal interacting with a tag of a web, according to an example embodiment of the present invention.

FIG. 5 shows a cross-sectional view of a radio frequency signal 502 interacting with tag 100f of web 200, according to an example embodiment of the present invention. As shown in FIG. 5, tags 100b, 100j, and other tags of web 200 are in contact with first portion 304 of contact surface 302. Thus, these tags are inhibited from operation by contact surface 302. However, as shown in FIGS. 4 and 5, tag 100f is adjacent to second portion 306 of contact surface 302. Thus, the operation of tag 100f is not inhibited, because second portion 306 does not inhibit its operation. Tag 100f can therefore be interacted with by a RF signal 502, transmitted by an antenna 506 of a RF signal source 504, without interference from unwanted responses by other tags 100 of web 200. This is because, as described above, second portion 306 is an opening through contact surface 302, or an electrically non-conductive material, so does not cause tag 100f to be inhibited.

RF signal 502 may include a test signal and/or a programming signal. RF signal source 504 can be a RFID reader, for example. Thus, in an embodiment, RF signal source 504 can communicate according to any RFID communication protocol, including those described elsewhere herein, a binary traversal protocol, a slotted aloha protocol, Class 0, Class 1, and EPC Gen 2, for example.

Note that in the example embodiment of FIG. 5, antenna 506 transmits RF signal 502 through contact surface 302 to tag 100f. RF signal 502 passes through second portion 306. In such an embodiment, contact surface 302 acts as a RF shield, to shield RF signal 502 from tags 100b and 100j. Furthermore, in such an embodiment, second portion 306 is an opening or a non-RF shielding material.

Note that contact surface 302 may be a surface of an enclosure. For example, the enclosure may enclose antenna 506 to provide further shielding of RF signal 502.

As described above, in embodiments, the present invention accommodates different types of RFID tags without the need for changes to the assembly line. For example, to accommodate different tag sizes, an operator or automated mechanism can replace contact surface 302 with a second portion 306 of a size to accommodate the different tag size if required. Alternatively, contact surface 302 may be computer controlled to vary the size of second portion 306 as required, such as through the use of automated shutters, etc., through contact surface 302. Thus, little to no changes to the assembly line are required.

Figure 6:
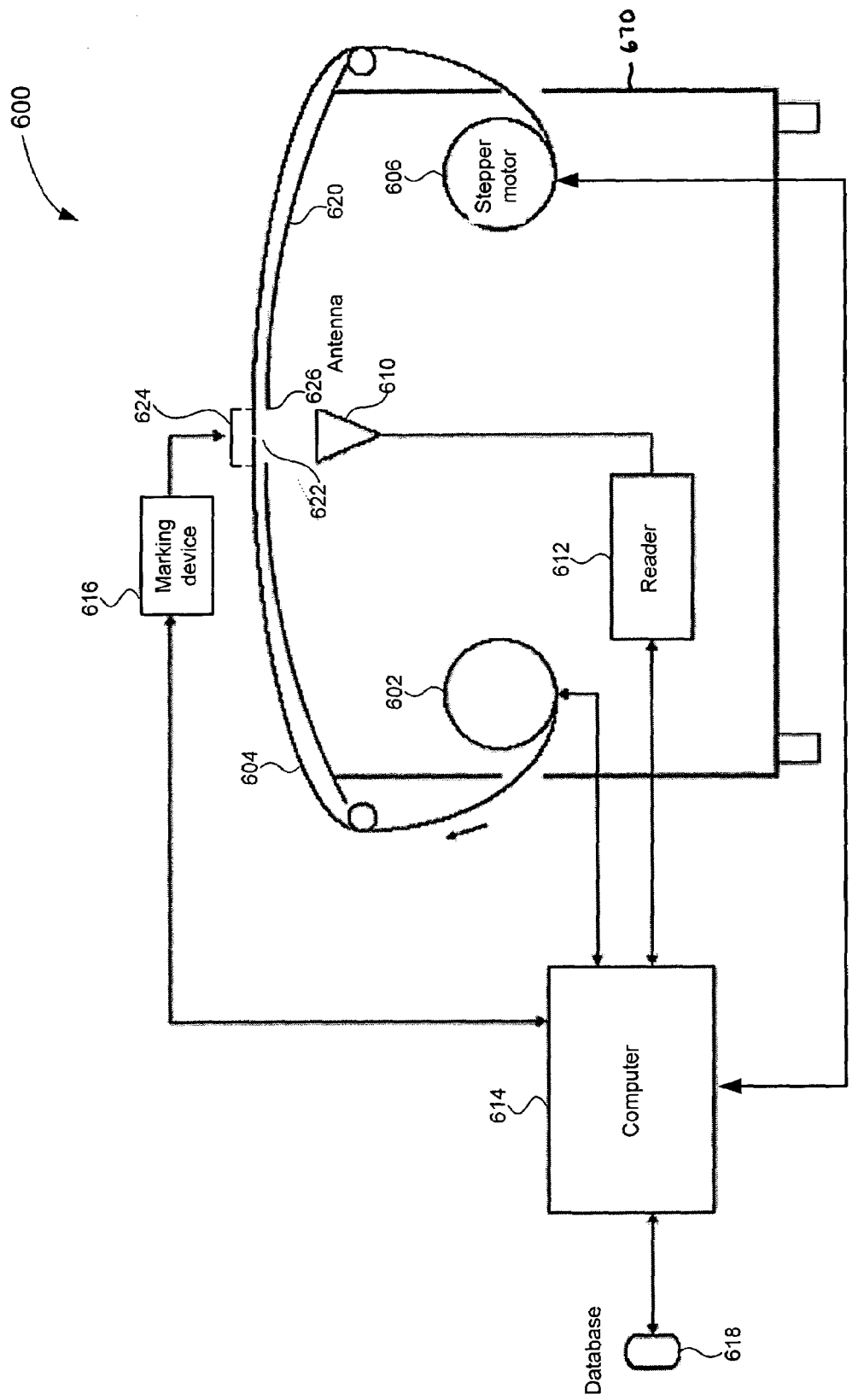
FIG. 6 shows an example of a high volume tester and programmer, according to an embodiment of the present invention.

FIG. 6 shows a view of an example tester and/or programmer 600 for interacting with tags (hereinafter "tester"), according to an embodiment of the present invention. As shown in FIG. 6, tester 600 includes a supply spool 602, a web 604, a collection spool with stepper motor 606, an antenna 610, a reader 612, a computer 614, a marking device 616, a database 618, a contact surface 620, and an enclosure 670.

In the present embodiment, tester 600 is an automated machine and is controlled by computer 614. One or more elements of tester 600 can be enclosed by enclosure 670. For example, as shown in FIG. 6, reader 612, antenna 610, supply spool 602, and stepper motor 606 are enclosed by enclosure 670. In an embodiment, enclosure 670 is a cabinet made from an electromagnetic signal shielding material, such as a metal, and/or is made from other materials.

In an embodiment, human intervention may be used to set up tester 600. In an embodiment, an operator identifies a roll or web of RFID tags to be tested or programmed, and loads tester 600 with a supply spool 602 containing the identified web (or roll). Computer 614 communicates with database 618 for information regarding the tags of the identified web. Database 618 uploads information such as testing and programming specifications, tag physical characteristics, and/or other information related to the testing and programming of tags (such as inlays or labels) to computer 614. Although shown separately in FIG. 6, database 618 can be maintained in computer 614.

In an embodiment, RFID tags enter the testing and/or programming phase in the continuous web form of web 604 contained on supply spool 602. Alternatively, web 604 may be supplied in the form of discrete rectangular sheets of tags, or in other forms. Supply spool 602 supplies web 604 to tester 600 for testing and/or programming. Web 604 is moved across contact surface 620 and across an ungrounded area 622 of contact surface 620 to collection spool 606. Contact surface 620 provides an electrical ground (or other suitable potential) contact to ground the portion of the RFID articles of web 604 in contact with contact surface 620. Thus, ungrounded portion 622 is an example of second portion 306 of FIG. 3, and the remainder of contact surface 620 is an example of first portion 304 of FIG. 3.

In an embodiment, contact surface 620 is a planar or curved metal shield, but can have shapes and configurations. For example, contact surface 620 may be a portion of enclosure 670, such as a top portion of enclosure 670, as shown in FIG. 6, configured similarly to a cabinet or table. Alternatively or additionally, contact surface 620 may comprise at least one metal clamp or other grounding instrument that clamps on a portion of web 604 where electrical grounding is desired. In yet another embodiment, contact surface 620 is a conveyor belt with metal contact regions for grounding tags in contact with the contact regions. In embodiments, various other techniques known in the art can be used to electrically ground materials of web 604.

The grounding of web 604 prevents interaction of nearby RF signals/fields with tags of web 604. However, at any particular moment, a portion 624 of web 604 is desired to be tested and/or programmed. Web portion 624 is positioned adjacent to ungrounded portion 622 of contact surface 620 to be tested and/or programmed. Web portion 624 comprises one or more tags, depending upon the configuration of the ungrounded area 622 and on the testing and programming specifications. Web portion 624 is not grounded (due to ungrounded portion 622 of contact surface 620), and thus can be interacted with. In the embodiment of FIG. 6, ungrounded area 622 is an opening 626 over which web 604 traverses. Thus, web portion 624 is freed from contact with ground, thereby allowing it to be tested and/or programmed by a RF field.

In an embodiment, opening 626 can be variably adjusted in size and/or shape to accommodate different types of RFID articles to be tested. The adaptability of the size and/or shape of opening 626 allows tester 600 to be adaptable, thus eliminating the need for specific dies or testing machines for a particular RFID article. In addition, the adaptability of opening 626 allows for more accurate control of the exposure of the RF field to web portion 624. This minimizes or eliminates the effect on adjacent tags of web 604.

In another embodiment, ungrounded area 622 includes a structure made of an electrically nonconductive material. Thus, in an embodiment, web 604 is supported or held by the material of ungrounded area 622. For example, if the contact surface 620 is a metal shield, then part of the metal shield over which web 604 traverses can be made of an electrically nonconductive material, thereby creating an ungrounded portion of web 604. In yet another embodiment, the ungrounded area may include a clamp made of nonconductive material, or is another mechanism or instrument for decoupling web portion 624 from ground. For example, ungrounded area 622 may include a non-electrically conductive wheel or bump, etc., to raise web portion 624 from contact with contact surface 620.

In FIG. 6, the testing and/or programming is accomplished by exposure to a RF field. Antenna 610 emits an RF signal generated by reader 612.

Reader 612 can be a conventional tag reader, or can be a reader designed for use in a tag test and/or programming environment. The characteristics of the RF field are controlled by reader 612, which is controlled by computer 614. In the embodiment of FIG. 6, antenna 610 is located on the opposite side of contact surface 620 from which web 604 is located. In such a configuration, contact surface 620 acts both as a grounding mechanism and as a RF shield for web 604. However, in alternative embodiments, antenna 610 can be located elsewhere, including on the same size of contact surface 620 as web 604.

In an embodiment, it may be desirable to mark a tested and/or programmed RFID article in the event a RFID article fails a test and/or fails to be programmed, or for other reasons. In such an embodiment, tester 600 includes marking device 616 to mark a tag on web 604 for later identification. Once a tag is marked, it can be identified for sorting, removal, retesting, recycling, or any other purpose. Marking device 616 is controlled by computer 614. In an embodiment, computer 614 tracks a tag to be marked as it is moved with web through tester 600. This allows for flexibility in placing marking device 616 at or downstream from the testing and/or programming stage while maintaining the location of the tag to be marked.

In an embodiment, the marking device 616 is a residue depositing device that deposits an ink, paint, or any other staining or marking material. In yet another embodiment of the present invention, the marking device 616 is a punching device. Such punching device may punch a hole partially or wholly through the tag being marked, including making an indentation in the tag.

Figure 7:
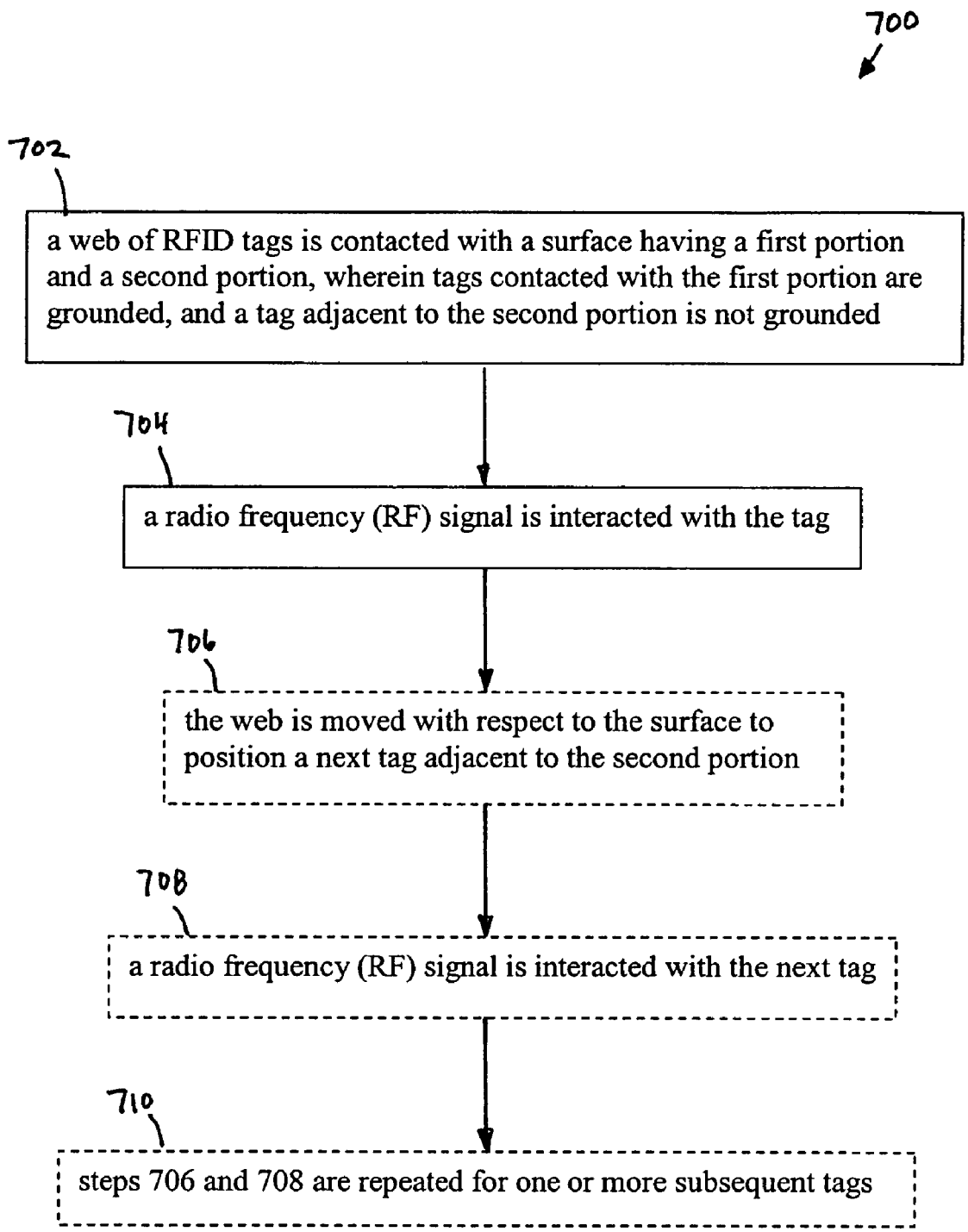
FIG. 7 shows an example flowchart for interacting with a tags of a web of tags, according to an embodiment of the present invention.

FIG. 7 shows an example flowchart 700 for interacting with a tags of a web of tags, according to an embodiment of the present invention. For example, the structural embodiments described herein may operate according to flowchart 700 in particular applications. Although described in terms of a web of tags, flowchart 700 may be applied to a plurality of tags supplied in any format, including a roll. Other structural and operational embodiments will be apparent to persons skilled in the relevant art(s) based on the following discussion related to flowchart 700. The steps shown in FIG. 7 do not necessarily have to occur in the order shown. The steps of FIG. 7 are described in detail below.

Flowchart 700 begins with step 702. In step 702, a web of RFID tags is contacted with a surface having a first portion and a second portion, wherein tags contacted with the first portion are grounded, and a tag adjacent to the second portion is not grounded. For example, the web may be a web similar to web 200 shown in FIG. 2. Furthermore, in an embodiment, the surface can be contact surface 302 shown in FIG. 3. Contact surface 302 has a first portion 304 that is grounded, and a second portion 306. FIG. 4 shows a tag 100f adjacent to second portion 306 that is not grounded. In another embodiment, the surface of step 702 may be contact surface 620 shown in FIG. 6.

In step 704, a radio frequency (RF) signal is interacted with the tag. For example, FIG. 5 shows an RF signal 502 interacting with tag 100f. FIG. 6 shows an antenna 610 that can transmit an RF signal to interact with a tag located in web portion 624 of web 604. The RF signal may include a test signal to test functionality/operation of the tag and/or may include a programming signal to program the tag. For example, the programming signal may be used to write an identification number or other data to the tag. Computer 614 may be present to control reader 612.

Steps 706, 708, and 710 are optional. These steps may be performed in embodiments where a plurality of tags are to be interacted with in a web.

In step 706, the web is moved with respect to the surface to position a next tag adjacent to the second portion. For example, FIG. 6 shows a supply spool 602 and collection spool with stepper motor 606 that may be used to move a web with respect to a surface, such as contact surface 620. Computer 614 may be present to control stepper motor 606. The web is moved to position a next tag, such as tag 100b shown in FIG. 5, adjacent to the second portion (e.g., not grounded) of the surface. Furthermore, in an embodiment, contact surface 620 may be additionally or alternatively moved. Still further, contact surface 620 may have a plurality of controllable ungrounded areas 622 arranged to span a width of web 604. For example, the plurality of controllable ungrounded areas 622 may be activated/opened sequentially by computer 614, to sequential test tags across the width of web 604 (e.g., to sequentially test tags 100*a*–*d* across the width of web 200 shown in FIG. 2).

In step 708, a radio frequency (RF) signal is interacted with the next tag. For example, antenna 610 shown in FIG. 6 can transmit an RF signal to interact with the next tag located in web portion 624 of web 604.

In step 710, steps 706 and 708 are repeated for one or more subsequent tags. Thus, according to step 710, any number of tags in a web can be interacted with as desired by the particular application, including interacting serially with the tags of the web in a continuous fashion until all of the tags of the web have been interacted with. Furthermore, in embodiments, multiple tags may be simultaneously interacted with in a web, using multiple interaction stations, such as shown in FIGS. 5 and 6. The stations may be RF shielded from each other, such as by using multiple enclosures 670, to prevent interference.

It should be understood that elements of the systems described herein can be implemented in hardware, firmware, software, or a combination thereof. For example, hardware, firmware, or module of software can perform one or more of the illustrated components of FIG. 6 (e.g., computer 614, reader 612) and/or steps of FIG. 7. For example, the hardware, firmware, software, or any combination thereof, may include algorithms for testing and/or programming tags, including the control of reader 612, stepper motor 606, and/or marking device 616.

In this document, the terms "computer program medium" and "computer usable medium" are used to generally refer to media such as a removable storage unit, a hard disk installed in hard disk drive, and signals (i.e., electronic, electromagnetic, optical, or other types of signals capable of being received by a communications interface). These computer program products are means for providing software to a computer system. The invention, in an embodiment, is directed to such computer program products.

In an embodiment where aspects of the present invention are implemented using software, the software may be stored in a computer program product and loaded into computer system using a removable storage drive, hard drive, or communications interface. The control logic (software), when executed by a processor, causes the processor to perform the functions of the invention as described herein.

According to an example embodiment, a computer executes computer-readable instructions to control one or more of a stepper motor, a reader, and a marker device. For instance, a computer may control movement of a roll or web to test the various tags in the web by controlling the stepper motor. Furthermore, the computer may instruct the reader to generate test and/or programming signals synchronized with the movement of the web. Tags may be communicated with by the reader according to any suitable communication protocols, including binary traversal protocols, slotted aloha protocols, Class 0, Class 1, EPC Gen 2, those mentioned elsewhere herein, and future protocols. Still further, the computer may control the marking of defective tags by the marking device.

In another example embodiment, aspects of the present invention are implemented primarily in hardware using, for example, hardware components such as application specific integrated circuits (ASICs). Implementation of the hardware state machine so as to perform the functions described herein will be apparent to one skilled in the relevant art(s).

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A system for interacting with radio frequency identification (RFID) tags, comprising:
    a surface in contact with a plurality of RFID tags, wherein the surface has a first portion and a second portion, wherein the first portion of the surface is grounded to ground tags of the plurality of tags that are in contact with the first portion; and
    a radio frequency (RF) source that transmits a RF signal to interact with a tag adjacent to the second portion of the surface.

2. The system of claim 1, wherein the surface is a metal shield.

3. The system of claim 1, wherein the second portion of the surface is an opening through the surface.

4. The system of claim 1, wherein the second portion of the surface includes an electrically nonconductive material.

5. The system of claim 1, further comprising:
    a marking device for marking failed tags of the plurality of tags.

6. The system of claim 1, wherein the plurality of tags are in roll format.

7. The system of claim 1, wherein the plurality of tags are in web format.

8. The system of claim 7, further comprising:
    a reel for receiving the web; and
    a stepper motor coupled to the reel.

9. The system of claim 6, further comprising:
    a computer coupled to the RF source and the stepper motor.

10. The system of claim 1, wherein the RF signal is a test signal.

11. The system of claim 1, wherein the RF signal is a programming signal.

12. The system of claim 1, wherein the RF source transmits the RF signal through the second portion to the tag.

13. A method for interacting with a radio frequency identification (RFID) tag, comprising:
    (a) contacting a plurality of RFID tags to a surface having a first portion and a second portion, wherein the first portion of the surface is grounded, wherein tags of the plurality of RFID tags are in contact with the first portion except for a tag adjacent to the second portion; and
    (b) transmitting a radio frequency (RF) signal to the tag adjacent to the second portion.

14. The method of claim 13, further comprising:
    testing the tag with the RF signal.

15. The method of claim 13, further comprising:
    programming the tag with the RF signal.

16. The method of claim 13, wherein the second portion is an opening through the surface, wherein step (a) comprises:
    positioning the tag adjacent to the opening.

17. The method of claim 16, wherein step (b) comprises: transmitting the RF signal through the opening to the tag.

18. The method of claim 13, further comprising:
(c) receiving the plurality of tags in a roll format.

19. The method of claim 13, further comprising:
(c) receiving the plurality of tags in a web format.

20. The method of claim 19, further comprising:
(d) moving the web of RFID tags to position a second tag adjacent to the second portion; and
(e) transmitting a second RF signal to the second tag.

21. The method of claim 13, wherein the second portion of the surface comprises a non-electrically conductive material, wherein step (a) comprises:
positioning the tag adjacent to the non-electrically conductive material.

22. A method for testing and/or programming a radio frequency identification (RFID) tag, comprising:
(a) grounding a portion of a web of RFID tags;
(b) ungrounding a portion of the grounded portion; and
(c) exposing the ungrounded portion to a radio frequency (RF) field.

23. The method of claim 22, wherein step (a) comprises the step of:
grounding the web with a metal contact.

24. The method of claim 23, wherein step (b) comprises the step of:
(1) moving a first portion of the grounded portion of the web across an opening in the metal contact to remove contact to ground for the first portion.

25. The method of claim 24, further comprising:
(d) varying an area of the opening.

26. The method of claim 23, wherein step (b) further comprises the step of:
(2) moving a first portion of the grounded portion of the web across an electrically nonconductive portion of the metal contact to remove contact to ground for the first portion.

27. The method of claim 22, wherein step (b) comprises: ungrounding a RFID tag.

28. The method of claim 23, wherein step (c) comprises: exposing the RFID tag to the RE field.

29. The method of claim 22, wherein the RF field comprises a test signal, further comprising:
(d) marking the RFID tag in the web if the RFID tag fails a test of the test signal.

30. A method for interacting with a radio frequency identification (RFID) tag, comprising:
(a) unreeling a spool of RFID tags across a shield having an opening, wherein a portion of the spool of RFID tags is in contact with the shield to provide a grounded portion of the RFID tags;
(b) ungrounding a portion of the grounded portion of the RFID tags by decoupling contact with the shield using the opening; and
(c) exposing the ungrounded portion of the RFID tags to a radio frequency (RF) signal through the opening.

31. A system for interacting with radio frequency identification (RFID) tags, comprising:
grounding means having a surface in contact with a plurality of RFID tags, wherein the surface has a first portion and a second portion, wherein the first portion of the surface is grounded to ground tags of the plurality of tags that are in contact with the first portion; and
radio frequency (RF) generating means that generates a RF signal to interact with a tag adjacent to the second portion of the surface.

32. A system for interacting with a radio frequency identification (RFID) tag, comprising:
spool means for supplying a spool of RFID tags across a shield having an opening, wherein a portion of the spool of RFID tags is in contact with the shield to provide a grounded portion of the RFID tags, wherein a portion of the RFID tags adjacent to the opening are ungrounded; and
means for exposing the ungrounded portion of the RFID tags to a radio frequency (RF) signal through the opening.

* * * * *

UNITED STATES PATENT AND TRADEMARK OFFICE
CERTIFICATE OF CORRECTION

PATENT NO. : 7,187,293 B2
APPLICATION NO. : 11/205026
DATED : March 6, 2007
INVENTOR(S) : White et al.

It is certified that error appears in the above-identified patent and that said Letters Patent is hereby corrected as shown below:

Column 12
Line 2 "the RE field" should be replaced with --the RF field--.

Signed and Sealed this

Fifth Day of June, 2007

JON W. DUDAS
*Director of the United States Patent and Trademark Office*